United States Patent
Wang et al.

(10) Patent No.: US 9,299,735 B2
(45) Date of Patent: Mar. 29, 2016

(54) IMAGE SENSOR PACKAGE STRUCTURE AND METHOD

(71) Applicant: China Wafer Level CSP Co., Ltd., Suzhou (CN)

(72) Inventors: Zhiqi Wang, Suzhou (CN); Qiong Yu, Suzhou (CN); Wei Wang, Suzhou (CN)

(73) Assignee: China Wafer Level CSP Co., Ltd., Suzhou (CN)

( * ) Notice: Subject to any disclaimer, the term of this patent is extended or adjusted under 35 U.S.C. 154(b) by 8 days.

(21) Appl. No.: 14/462,739

(22) Filed: Aug. 19, 2014

(65) Prior Publication Data

US 2015/0137294 A1    May 21, 2015

(30) Foreign Application Priority Data

Nov. 19, 2013    (CN) .......................... 2013 1 0585393
Nov. 19, 2013    (CN) .......................... 2013 1 0585564

(51) Int. Cl.
    *H01L 27/146* (2006.01)
(52) U.S. Cl.
    CPC .... *H01L 27/14632* (2013.01); *H01L 27/14618* (2013.01); *H01L 27/14687* (2013.01); *H01L 2224/48091* (2013.01); *H01L 2224/48227* (2013.01); *H01L 2924/16235* (2013.01)
(58) Field of Classification Search
    CPC .................................................... H01L 27/146
    USPC .............. 257/431, 432, 434; 438/113, 67, 69, 438/456, 460, 116
    See application file for complete search history.

(56) References Cited

U.S. PATENT DOCUMENTS

| | | | |
|---|---|---|---|
| 6,147,389 A * | 11/2000 | Stern et al. ..................... | 257/434 |
| 6,492,699 B1 | 12/2002 | Glenn et al. | |
| 7,001,797 B2 * | 2/2006 | Hashimoto ................... | 438/113 |
| 7,785,915 B2 * | 8/2010 | Farnworth ...................... | 438/67 |
| 2006/0033219 A1 | 2/2006 | Kalidas et al. | |

FOREIGN PATENT DOCUMENTS

CN             101032021 A         9/2007

OTHER PUBLICATIONS

Chinese Office Action dated Jun. 30, 2015 from corresponding Chinese Application No. 201310585564.1.

* cited by examiner

*Primary Examiner* — Sheng Zhu
(74) *Attorney, Agent, or Firm* — Wolf, Greenfield & Sacks, P.C.

(57) ABSTRACT

Image sensor package structure and method are provided. The method includes: providing first substrate having upper surface on which image sensing areas and pads are formed; providing second substrate having through holes; forming tape film on upper surface of second substrate to seal each through hole; contacting lower surface of second substrate with upper surface of first substrate to make image sensing areas in through holes; removing portions of tape film and second substrate, wherein remained tape film and second substrate form cavities including sidewalls made of second substrate and caps sealing sidewalls and made of tape film, and remained second substrate also covers pads; removing portions of remained second substrate to expose pads; slicing first substrate to form single image sensor chips including image sensing areas and pads; and electrically connecting pads with circuits on third substrate through wires. Pollution or damage to image sensing areas may be avoided.

38 Claims, 8 Drawing Sheets

IMAGE SENSOR PACKAGE STRUCTURE AND METHOD

CROSS-REFERENCE TO RELATED APPLICATIONS

The present application claims priority to Chinese patent application No. 201310585393.2, filed on Nov. 19, 2013, and entitled "IMAGE SENSOR PACKAGE STRUCTURE AND METHOD" and Chinese patent application No. 201310585564.1, filed on Nov. 19, 2013, and entitled "IMAGE SENSOR PACKAGE STRUCTURE AND METHOD", and the entire disclosures of which are incorporated herein by reference.

TECHNICAL FIELD

The present disclosure generally relates to semiconductor packaging technology, and more particularly, to an image sensor package structure and method.

BACKGROUND

Image sensors can receive optical signals from objects and convert them into electrical signals, which can be transmitted for further processing, such as being digitalized, and stored in a storing device (for example, a memory, an optical disk or a magnetic disk), or displayed on a displayer. Image sensors are usually used in digital cameras, vidicons, scanners, fax machines and etc. Generally, there are two types of image sensors, including Charge Coupled Device (CCD) image sensors and Complementary Metal Oxide Semiconductor (CMOS) image sensors. Compared with a CCD image sensor, a CMOS image sensor features with higher integration level, less power consumption, lower production cost and etc.

With the image sensors getting smaller and smaller, and pads in the image sensors being more and more, distances between adjacent pads in image sensors become smaller, which brings more difficulty for packaging image sensors.

Among various existing packaging technologies of image sensor chips. Chip on Board (COB) packaging technology is more widely used. This is because a product packaged by the COB packaging technology normally has advantages of high reliability, high stability, high integration level, a small size, simple manufacturing processes, low package cost, and the product can be easily used.

Referring to FIG. 1, in a COB packaging process, an image sensor chip 31 is attached onto a circuit board 34 directly using an adhesive agent or a bonding method, such as automatic tape bonding, wire bonding or flip-chip bonding method. Then pads 32 on the image sensor chip 31 are electrically connected with connection points on the circuit board 34 by a wire bonding technology. During the COB packaging process, the image sensor chip 31 is not protected by a protection device, thus, an image sensing area 33 on the image sensor chip 31 is prone to be polluted or damaged.

SUMMARY

In embodiments of the present disclosure, pollution or damage to image sensor chips may be avoided during a packaging process of the image sensor chips, and production efficiency of packaging may be improved.

In an embodiment, an image sensor package method is provided, including: providing a first substrate, wherein the first substrate has an upper surface on which a plurality of image sensing areas and a plurality of pads are formed; providing a second substrate which has a plurality of through holes formed therein; forming a tape film on an upper surface of the second substrate to seal one end of each of the plurality of through holes; contacting a lower surface of the second substrate with the upper surface of the first substrate to make the plurality of image sensing areas disposed in the plurality of through holes and the plurality of pads disposed outside the through holes; removing portions of the tape film and portions of the second substrate by cutting, wherein the remained tape film and the remained second substrate form cavities each of which includes a sidewall made of a portion of the second substrate and a cap which seals the sidewall from the top and is made of a portion of the tape film, and the remained second substrate also covers the plurality of pads; removing portions of the remained second substrate to expose the plurality of pads; slicing the first substrate to form a plurality of single image sensor chips each of which includes at least one of the image sensing areas and at least one of the pads; and electrically connecting the at least one pad on one of the plurality of single image sensor chips with a circuit on a third substrate through wires.

Optionally, a blade may be used to cut the portions of the tape film and the portions of the second substrate.

Optionally, the remained second substrate after the cutting includes portions, which overlay the plurality of pads, having a thickness less than 20 µm.

Optionally, the second substrate may include resin.

Optionally, the second substrate may include glass, silicon or ceramic.

Optionally, the lower surface of the second substrate includes an adhesive layer which is the lowest layer of the second substrate, and the second substrate is attached with the upper surface of the first substrate through the adhesive layer.

Optionally, the adhesive layer may include epoxy resin adhesive, polyimide adhesive, benzocyclobutene adhesive or polybenzoxazole adhesive.

Optionally, removing portions of the remained second substrate to expose the plurality of pads includes: etching the remained second substrate with the remained tape film as a mask until the plurality of pads are exposed.

Optionally, removing portions of the remained second substrate to expose the plurality of pads includes: partially removing the remained second substrate to form openings which are exactly on the plurality of pads by a laser stripping process.

Optionally, after the portions of the tape film and the portions of the second substrate are removed by cutting, there are some portions of the adhesive layer remained overlaying the plurality of pads, and thereafter the remained portions of the adhesive layer are etched to expose the plurality of pads with the remained tape film as a mask.

Optionally, etching the remained second substrate with the remained tape film as a mask until the plurality of pads are exposed or etching the remained portions of the adhesive layer to expose the plurality of pads with the remained tape film as a mask may employ a dry plasma stripping process.

Optionally, after the portions of the tape film and the portions of the second substrate are removed by cutting, there are some portions of the adhesive layer remained overlaying the pads, and thereafter the remained portions of the adhesive layer are partially removed by a laser stripping process to form openings which are exactly on the pads, such that the pads are exposed.

Optionally, the tape film may include an Ultraviolet Ray (UV) peptization tape or a thermal peptization tape.

Optionally, the method may further include: before the cutting, forming a protective film on the tape film, such that after the cutting, portions of the protective film are remained to cover the remained tape film.

Optionally, the protective film may include photoresist.

Optionally, the protective film may be formed by spin coating, spraying or overlaying.

Optionally, removing portions of the remained second substrate or portions of the remained adhesive layer on the plurality of pads by a laser stripping process includes: lasers emitted by a laser head focusing on a portion of the remained second substrate or on a portion of the remained adhesive layer, wherein the focused portion aligns with one particular pad of the plurality of pads; and the laser head moving back and forth relative to the first substrate, to remove the focused portion to form an opening which exposes the surface of the particular pad.

Optionally, during the laser stripping process, pulse length of the lasers may be within a range from 1 ns to 200 ns, pulse frequency may be within a range from 80 KHz to 200 KHz, energy of the lasers on a focus point may be greater than 1E18 W/cm$^2$, and a relative moving speed of the laser head may be within a range from 1 mm/s to 25 mm/s.

Optionally, the laser stripping process may include a plurality of laser etching processes, such that the focused portion of the remained second substrate or the focused portion of the remained adhesive layer is partially removed in each of the laser etching processes until all focused portions of the remained second substrate or all focused portions of the remained adhesive layer are removed.

Optionally, the laser stripping process may include a plurality of laser etching processes, and laser powers in the plurality of laser etching processes may be the same or different.

Optionally, the plurality of laser etching processes may include at least a first laser etching process and a second laser etching process, where the focused portion of the remained second substrate or the focused portion of the remained adhesive layer is partially removed during the first laser etching process to form a groove, and the focused portion of the remained second substrate or the focused portion of the remained adhesive layer is completely removed during the second laser etching process, to form the opening which exposes the particular pad.

Optionally, laser power in the first laser etching process is greater than that in the second laser etching process.

Optionally, the focused portion of the remained second substrate or the focused portion of the remained adhesive layer has a first thickness reduction during the first laser etching process and a second thickness reduction during the second laser etching process, and the first thickness reduction is greater than the second thickness reduction.

Optionally, the laser stripping process may be repeated to form a plurality of openings exposing all the plurality of pads, respectively.

Optionally, there are a plurality of pads disposed on two sides of the particular image sensing area, and on each side of the particular image sensing area, the pads are arranged in one line, wherein the laser stripping process includes: the lasers emitted by a laser head focusing on a strip of the remained second substrate, wherein the strip of the remained second substrate exactly covers the pads arranged in the one line and portions of the first substrate disposed between each pair of adjacent pads in the one line; and the laser head moving back and forth relative to the first substrate, to remove the strip of the remained second substrate to form an opening which exposes the pads arranged in the one line and the portions of the first substrate disposed between each pair of adjacent pads in the one line.

In an embodiment, an image sensor package method is provided, including: providing a first substrate, wherein the first substrate has an upper surface on which a plurality of image sensing areas and a plurality of pads are formed; providing a second substrate and contacting a lower surface of the second substrate with the upper surface of the first substrate; removing a portion of the second substrate on the pad by cutting; removing the remained second substrate on the pad to expose the plurality of pads; slicing the first substrate to form a plurality of single image sensor chips each of which includes at least one of the image sensing areas and at least one of the pads; and electrically connecting the at least one pad on one of the plurality of single image sensor chips with a circuit on a third substrate through wires.

Optionally, the remained second substrate on the pad may be removed by a dry plasma stripping process.

Optionally, the remained second substrate on the pad may be removed by a laser stripping process.

In an embodiment, an image sensor package structure is provided, including: an image sensor chip, on an upper surface of the image sensor chip there are formed an image sensing area and at least one pad; a cavity, formed by a cavity wall and a tape layer, accommodating the image sensing area inside and keeping the at least one pad outside, wherein the cavity wall is formed on the upper surface of the image sensor chip between the image sensing area and the at least one pad, and the cavity wall surrounds the image sensing area, wherein the tape layer is formed on an upper surface of the cavity wall, and the tape layer seals a space which is above the image sensing area and surrounded by the cavity wall; a third substrate which has a circuit formed thereon, an upper surface of the third substrate being attached with a lower surface of the image sensor chip; and wires which electrically connect the at least one pad on the image sensor chip with the circuit on the third substrate.

Optionally, the cavity wall may include resin.

Optionally, the cavity wall may include glass, silicon or ceramic.

Optionally, an adhesive layer may be formed between the cavity wall and the first substrate.

Optionally, the adhesive layer may include epoxy resin adhesive, polyimide adhesive, benzocyclobutene adhesive or polybenzoxazole adhesive.

Optionally, a first protective layer may be formed on the tape layer.

Optionally, the first protective layer may include photoresist.

Optionally, the image sensor package structure may further include a second protective layer, where the second protective layer covers the upper surface of the image sensor chip on two sides of the cavity wall and a portion of a sidewall of the cavity wall, and an opening exposing a surface of the pad is formed in the second protective layer.

Optionally, the second protective layer may include a same material with the cavity wall or the adhesive layer.

Optionally, the second protective layer may have a thickness less than a height of the cavity wall.

Optionally, the second protective layer may have a thickness less than 20 µm.

Optionally, the tape layer may include a UV peptization tape or a thermal peptization tape.

In embodiments of the present disclosure, image sensor package structures and methods are provided. In one of the methods, a first substrate is provided, on an upper surface of which there are formed a plurality of chip areas and a plurality of pads. And a second substrate is provided. The second substrate has a plurality of through holes formed therein. The through holes have first ends on a lower surface of the second substrate and second ends on an upper surface of the second substrate. The first ends are open, while the second ends are sealed by a tape film formed on the upper surface of the second substrate. Then the lower surface of the second substrate is brought into contact with the upper surface of the first substrate, where the image sensing areas are respectively disposed into the through holes through the corresponding first ends, and the plurality of pads are disposed outside the through holes. Thereafter, the second substrate and the tape film are partially removed to expose the pads, while the remained tape film and the remained second substrate form cavities each of which includes a sidewall made of a portion of the second substrate and a cap which seals the sidewall from the top and is made of a portion of the tape film, and the remained second substrate also covers the plurality of pads. Portions of the remained second substrate are removed to expose the plurality of pads. Then the first substrate is sliced to form a plurality of single image sensor chips each of which includes at least one of the image sensing areas and at least one of the pads. After that, the at least one pad on one of the image sensor chips is electrically connected with a circuit on a third substrate through wires. Since the image sensing areas are respectively disposed in cavities formed by sidewalls of the through holes and corresponding parts of the tape film, they can be protected from being polluted and/or damaged during image sensor packaging. The sidewalls and caps of cavities are formed by cutting, which avoids damage and pollution to the image sensing areas caused by other processes.

Further, the portions of the tape film and the portions of the second substrate are removed by cutting with a blade, which, compared with a dry etching process or a wet etching process, is more efficient and simpler, and causes less pollution. Besides, no mask layer is needed by cutting with the blade, which may avoid pollution or damage to the image sensing areas when a mask layer is formed and removed. The cutting process with the blade is a cryogenic process, which may avoid damage to the image sensing areas resulted from a too high temperature in other processes.

Further, no mask layer is needed when the portions of the remained second substrate on the plurality of pads are removed by a laser stripping process, that is, the remained second substrate on the plurality of pads can be removed selectively. The laser stripping process may not bring damage to the caps made of the tape film and the pads, thus, the caps may be protected better in a packaging process. Besides, a cutting process may be a cryogenic process and heat generated by the laser stripping process may focus on the portions of the remained second substrate on the pads which need to be removed, while the image sensing areas may not be affected by heat generated in the laser stripping process and the cutting process, so that a decrease in the detection sensibility of the image sensing areas resulted from damage due to a hyperthermia process may not happen. Besides, when the portions of the remained second substrate on the pads are removed selectively by a laser stripping process, the remained second substrate on the first substrate may serve as a protective layer to protect semiconductor devices in the first substrate. The remained second substrate on the first substrate may be combined with sidewalls of the cavities to form new sidewalls of the cavities with a shape of "L". Thus, a contact area between the new sidewalls of the cavities and surfaces of the first substrate may be greater, thereby improving the mechanical stability of the sidewalls of the cavities.

Further, when the second substrate includes glass, silicon or ceramic, an adhesive layer may be further contained in the second substrate. The lower surface of the second substrate is attached with the upper surface of the first substrate through the adhesive layer. Therefore, the adhesive layer is used to contact the first substrate with the second substrate.

Further, after the portions of the tape film and the portions of the second substrate are removed by cutting to form cavities including sidewalls and caps, some portions of the adhesive layer remained overlaying the plurality of pads and thereafter are etched to expose the plurality of pads. As a material of the adhesive layer is different from that of the sidewalls of the cavities, an etching selectivity ratio of the material of the adhesive layer to the material of the sidewalls of the cavities is increased, so that damage to the sidewalls of the cavities is very little. When the portions of the second substrate are etched to form the sidewalls of the cavities, the sidewalls may have a small thickness, which is benefit for improving an integration level of formed package devices.

Further, a first protective layer is formed on the tape layer. The first protective layer may be used to protect the tape layer on the cavity without being damaged, when the remained second substrate on the first substrate is removed by a dry plasma stripping process.

Further, when the portions of the remained second substrate or the portions of the remained adhesive layer on the plurality of pads are removed by a laser stripping process, a pulse length is within a range from 1 ns to 200 ns, pulse frequency is within a range from 80 KHz to 200 KHz, energy of the lasers on a focus point is greater than 1E18 W/cm$^2$, and a relative moving speed of a laser head is within a range from 1 mm/s to 25 mm/s. Under the laser stripping process with these parameters, the portions of the remained second substrate or the portions of the remained adhesive layer on the pads may be removed accurately, which avoids any residual second substrate or residual adhesive layer on the pads, brings no damage or little damage to the pads, and avoids damage to the caps of the cavities.

Further, the laser etching process may at least include a first laser etching process and a second laser etching process. In the first laser etching process, the remained second substrate or the remained adhesive layer on a particular pad is partially removed to form a groove. In the second laser etching process, the remained second substrate or the remained adhesive layer on the particular pad is completely removed to form an opening which exposes the particular pad. Laser power in the first laser etching process is greater than that in the second laser etching process, which ensures to remove the remained second substrate or the remained adhesive layer on the particular pad completely and reduces damage to the particular pad.

In embodiments of the present disclosure, damage or pollution to the image sensing areas in the image sensor package structure may be reduced, which improves the stability and reliability of package devices.

DETAILED DESCRIPTION

Figure 1:
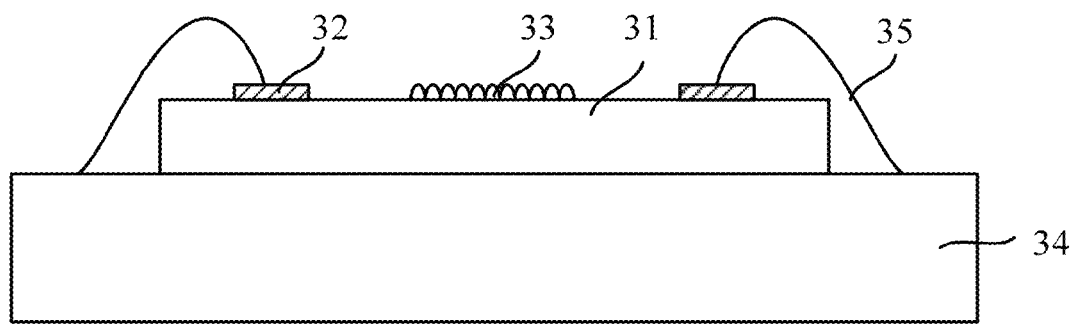
FIG. 1 is a schematic structural diagram of an image sensor package structure in prior art.

As described in background, when an image sensor chip is subject to a packaging process, an image sensing area in the image sensor chip is exposed and thus is prone to be polluted or damaged, which may further affects the reliability and stability of the resulting structure of the packaging process.

In embodiments of the present disclosure, image sensor package structures and methods are provided. In one of the methods, a first substrate is provided, on an upper surface of which there are formed a plurality of chip areas and a plurality of pads. And a second substrate is provided. The second substrate has a plurality of through holes formed therein. The through holes have first ends on a lower surface of the second substrate and second ends on an upper surface of the second substrate. The first ends are open, while the second ends are sealed by a tape film formed on the upper surface of the second substrate. Then the lower surface of the second substrate is brought into contact with the upper surface of the first substrate, where the image sensing areas are respectively disposed into the through holes through the corresponding first ends, and the plurality of pads are disposed outside the through holes. Thereafter, the second substrate and the tape film are partially removed to expose the pads, while the remained tape film and the remained second substrate form cavities each of which includes a sidewall made of a portion of the second substrate and a cap which seals the sidewall from the top and is made of a portion of the tape film, and the remained second substrate also covers the plurality of pads. Portions of the remained second substrate are removed to expose the plurality of pads. Then the first substrate is sliced to form a plurality of single image sensor chips each of which includes at least one of the image sensing areas and at least one of the pads. After that, the at least one pad on one of the image sensor chips is electrically connected with a circuit on a third substrate through wires. Since the image sensing areas are respectively disposed in cavities formed by sidewalls of the through holes and corresponding parts of the tape film, they can be protected from being polluted and/or damaged during image sensor packaging. The sidewalls and caps of cavities are formed by cutting, which avoids damage and pollution to the image sensing areas caused by other processes.

In order to clarify the objects, characteristics and advantages of the disclosure, embodiments of present disclosure will be described in detail in conjunction with accompanying drawings. For convenience, elements in the drawings are not necessarily drawn to scale and the drawings as examples are not meant to limit the present disclosure. In practice, three-dimensional sizes including length, width and depth should be considered.

FIGS. 2 to 8 are vertical and cross-sectional views of intermediate structures schematically illustrating a packaging process of an image sensor according to an embodiment of the present disclosure.

Figure 2:
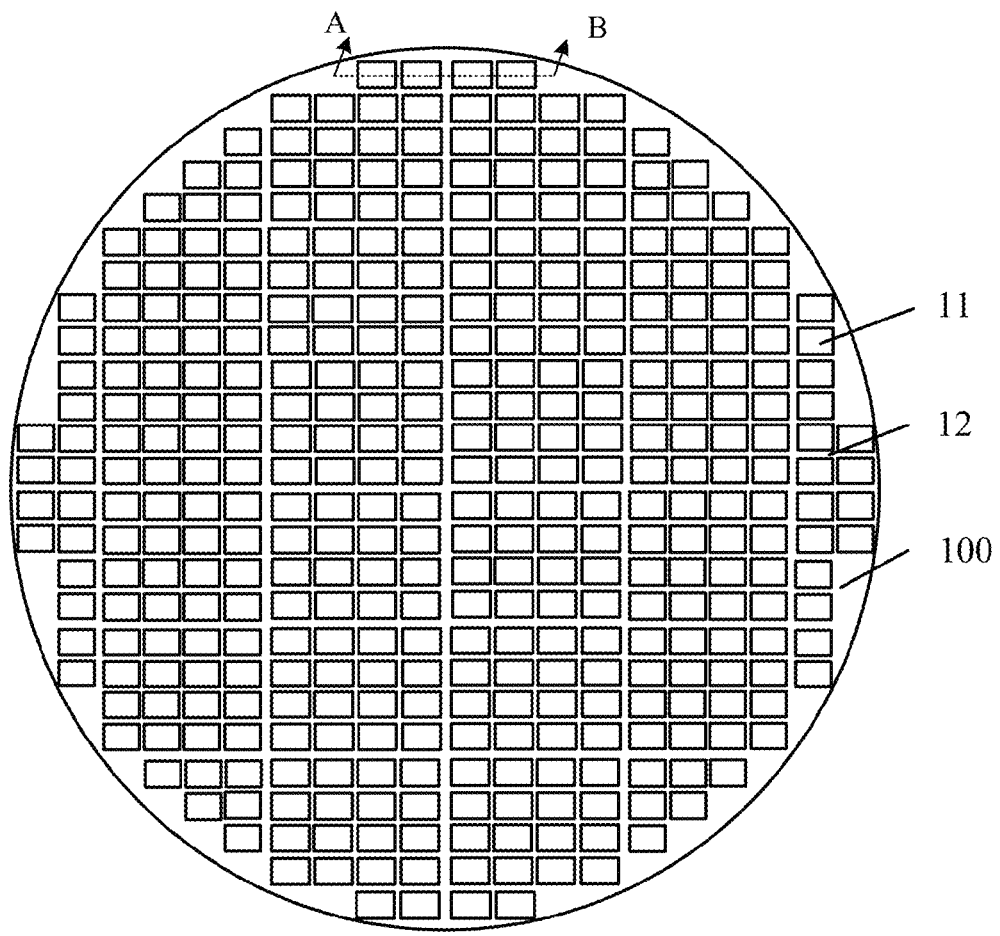
FIGS. 2 to 8 are vertical and cross-sectional views schematically illustrating intermediate structures of a packaging process of an image sensor according to an embodiment of the present disclosure.

FIG. 2 is a top view of a first substrate 100. Referring to FIG. 2, in some embodiments, the first substrate 100 may be a wafer. In some embodiments, the first substrate 100 includes a plurality of chip areas 11 arranged in rows and columns and a plurality of cutting trails 12 between adjacent chip areas 11. The plurality of chip areas 11 are used to form image sensor chips. In subsequent processes, the first substrate 100 may be sliced along the plurality of cutting trail areas 12 to form a plurality of single image sensor chips.

Figure 3:
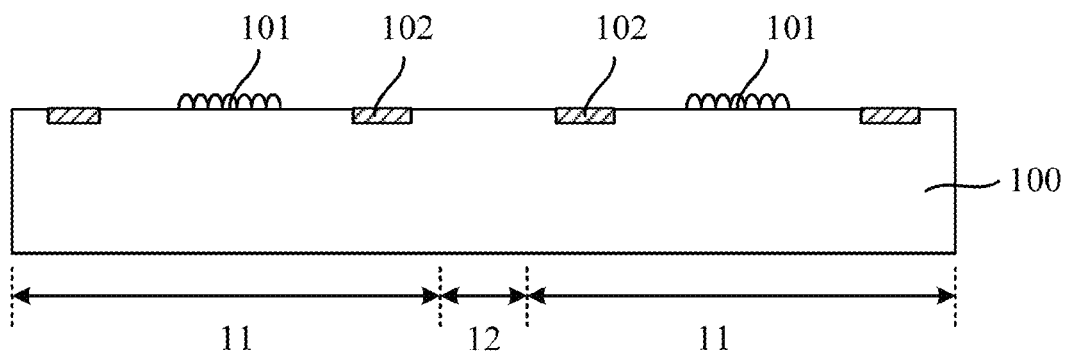

FIG. 3 schematically illustrates a cross-section of FIG. 2 cutting through A-B line. Referring to FIG. 3, there are a plurality of image sensing areas 101 and a plurality of pads 102 formed on an upper surface of the first substrate 100.

On the first substrate 100 and within each chip area 11, there are at least one image sensing area 101 and at least one pad 102. In some embodiments, in each chip area 11, there may be more than one image sensing areas and/or more than one pads. In some embodiments, each chip area 11 may have one image sensing area 101 and a plurality of pads 102 surrounding the image sensing area 101. The chip area 11 may further include metal interconnection structures which electrically connect the image sensing area 101 with the pad 102. The image sensing area 101 has an image sensor unit and a related circuit which is connected with the image sensor unit formed therein. The image sensing area 101 may be configured to receive and convert ambient rays to electrical signals, and transmit the electrical signals to other circuits on a third substrate through the metal interconnection structures, the pads 102 and wires to be formed subsequently.

In some embodiments, in each chip area 11, the image sensing area 101 is disposed on a central position of the chip area 11, and the pads 102 are disposed on periphery of the chip area 11. In some embodiments, the pads 102 and the image sensing area 101 may be disposed on other positions according to wiring requirements.

In some embodiments, the pads 102 in different chip areas 11 may be disposed independently. In some embodiments, the pads 102 in adjacent chip areas 11 are connected to each other, that is, the pads 102 are disposed across the cutting trails 12. The cutting trails 12 will be sliced subsequently, thus, the pads 102 across the cutting trials 12 will be cut, which may not influence electrical performance of any image sensor chips.

Figure 4:
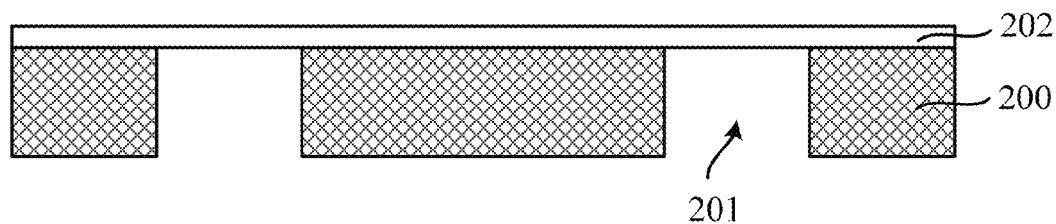

Referring to FIG. 4, a second substrate 200 which has a plurality of through holes 201 formed therein is provided. A tape film 202 is formed on an upper surface of the second substrate 200, the tape film 202 sealing a first end of each of the plurality of through holes 201.

In some embodiments, the second substrate 200 may include resin, such as Printed Circuit Board (PCB) resin. In some embodiments, the plurality of through holes 201 may be formed in the second substrate 200 by punching or drilling. After the tape film 202 is formed on the upper surface of the second substrate 200, the second substrate 200 is attached with the first substrate 100, to avoid damage to the image sensing areas 101. In subsequent processes, the pads 102 may be exposed by a cutting process and a dry plasma stripping process, which may improve packaging efficiency. Besides, portions of the tape film 202 and portions of the second substrate 200 may be removed by a cutting process and a dry plasma stripping process to form cavities each of which includes a sidewall made of a portion of the second substrate 200 and a cap which seals the sidewall from the top and is made of a portion of the tape film 202 and to expose surfaces of the pads 102, which avoids damage or pollution to pads and image sensing areas caused by forming cavities with existing depositing processes and etching processes.

After the through holes 201 are formed in the second substrate 200, the tape film 202 is formed on the upper surface of the second substrate 200. The tape film 202 seals the first end of each of the through holes 201, so that when the remained second substrate 200 on the pads 102 is cut and etched in subsequent processes, the image sensing areas 101 are not exposed to outside, which avoids pollution or damage to the image sensing areas 101.

In some embodiments, the tape film 202 may include a UV peptization tape, a thermal peptization tape or other suitable tapes. The tape film 202 may be attached to the upper surface of the second substrate 200 directly, which is a simple process. In subsequent processes, the tape film 202 may form caps of cavities which protect the image sensing areas in the image sensor without being polluted or damaged during the packaging process. After the image sensor package structure is formed, the caps may be easily removed by UV light irradiation in a subsequent assembling process, where the removing process will not bring damage or pollution to the image sensing areas.

In some embodiments, a protective film may be formed on the tape film 202. In subsequent processes, portions of the protective film, portions of the tape film 202 and portions of the second substrate 200 may be removed by cutting, wherein the remained protective film, the remained tape film 202 and the remained second substrate 200 form cavities, each of which includes a sidewall made of a portion of the second substrate 200 and a cap which seals the sidewall from the top and is made of a portion of the tape film 202, and a first protective layer on the caps. When the remained second substrate 200 on the first substrate 100 is removed by a dry plasma stripping process to expose the surfaces of the pads 102, the first protective layer may protect the caps of the cavities without being damaged.

The protective film may include photoresist and may be formed by spinning coating, spraying or overlaying. These processes for forming the protective film are simple and do not bring damage to the tape film. In some embodiments, the protective film may include other suitable materials or be formed by other processes.

In some embodiments, the through holes 201 are formed in the second substrate 200 and the tape film 202 sealing the first ends of the through holes 201 is formed on the upper surface of the second substrate 200. In subsequent processes, the cavities including sidewalls and caps are formed to isolate the image sensing areas from external environment. In some embodiments, no through hole may be formed in the second substrate 200. And in subsequent processes, a lower surface of the second substrate 200 may be directly attached with the upper surface of the first substrate 100, portions of the second substrate 200 may be removed by cutting, portions of the remained second substrate may be removed to expose the surfaces of the pads 102 by a dry plasma stripping process, the first substrate may be sliced to form a plurality of single image sensor chips, and the pads 102 on the plurality of single image sensor chips may be electrically connected to a circuit on the third substrate through wires. When the portions of the second substrate 200 are cut and the portions of the remained second substrate 200 are removed, portions of the second substrate 200 on the image sensing areas 101 may prevent the image sensing areas 101 from being damaged or polluted.

Figure 5:
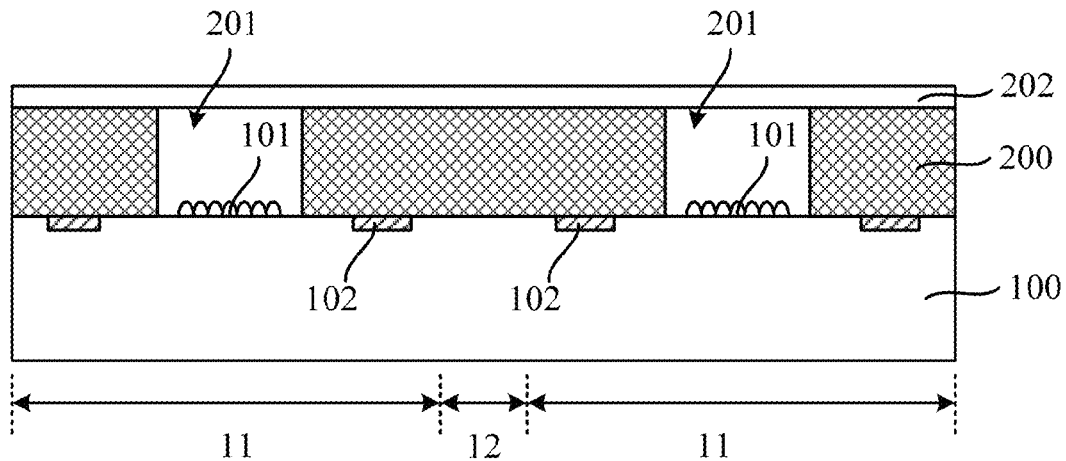

Referring to FIG. 5, the lower surface of the second substrate 200 is attached with the upper surface of the first substrate 100 to make the image sensing areas 101 disposed in the through holes 201.

In some embodiments, the second substrate 200 includes resin, thus, the second substrate 200 may be attached with the first substrate 100 directly to form an entirety. In some embodiments, a dispensing layer may be formed on the lower surface of the second substrate 200 by a dispensing process, and the second substrate 200 may be attached with the first substrate 100 to form an entirety through the dispensing layer.

After the second substrate 200 is attached with the first substrate 100, the image sensing areas 101 may be disposed in the through holes 201 in the second substrate 200. The second substrate 200 and the tape film 202 may seal the image sensing areas 101 and isolate them from external environment. Areas on the first substrate 100 except the image sensing areas 101 are covered by the second substrate 200.

Figure 6:
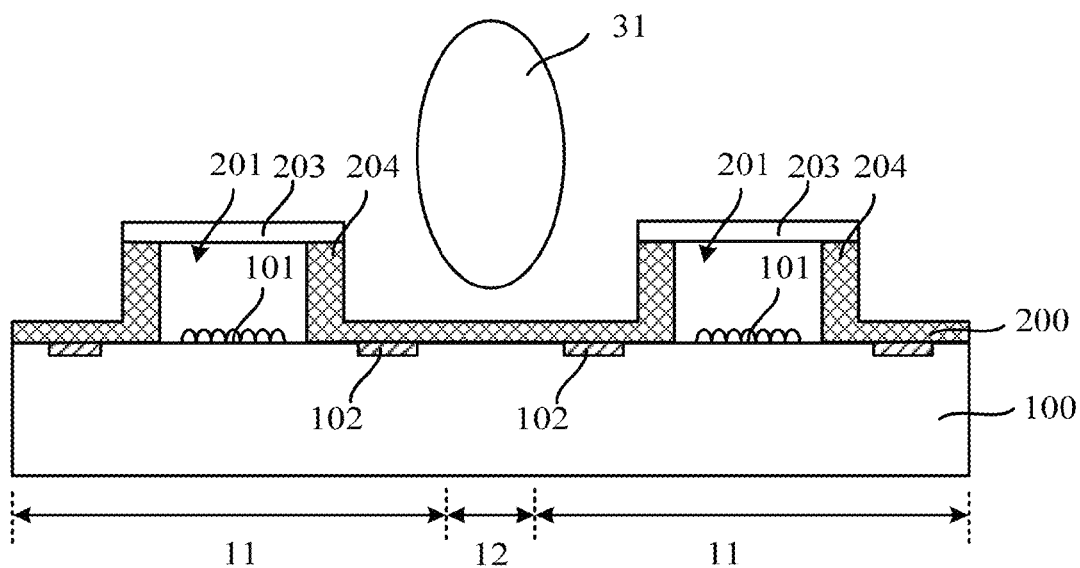

Referring to FIG. 6, portions of the tape film 202 (referring to FIG. 5) and portions of the second substrate 200 are removed by cutting to form a plurality of cavities each of which includes a sidewall 204 made of a portion of the second substrate 200 and a cap 203 which seals the sidewall 204 from the top and is made of a portion of the tape film 202.

The portions of the tape film 202 and the portions of the second substrate 200 are removed by cutting with a blade, which, compared with a dry etching process or a wet etching process, is more efficient and simpler, and causes less pollution. Besides, no etching gas or etching solution needs to be selected according to a material to be etched, and no mask layer is needed by cutting with the blade, which may avoid pollution or damage to the image sensing areas 101 when a mask layer is formed and removed. In some embodiments, the portions of the tape film 202 and the portions of the second substrate 200 are cut by a blade 31.

In some embodiments, after the portions of the tape film 202 and the portions of the second substrate 200 are cut, the remained second substrate 200 on the first substrate 100 may prevent damage to the pads 102 caused by over-segmentation in the cutting process. In subsequent processes, the remained second substrate 200 on the first substrate 100 may be partially removed to expose the surfaces of the pads 102 by a dry plasma stripping process. Then, the pads 102 may be connected with the circuit on the third substrate by wires.

In some embodiments, the remained second substrate 200 on the first substrate 100 after the cutting may include portions, which overlay the pads 102, having a thickness less than 20 μm, which may make the duration of a subsequent dry plasma stripping process shorter and reduce etching to the sidewalls 204 of the cavities during the dry plasma stripping process.

Figure 7:
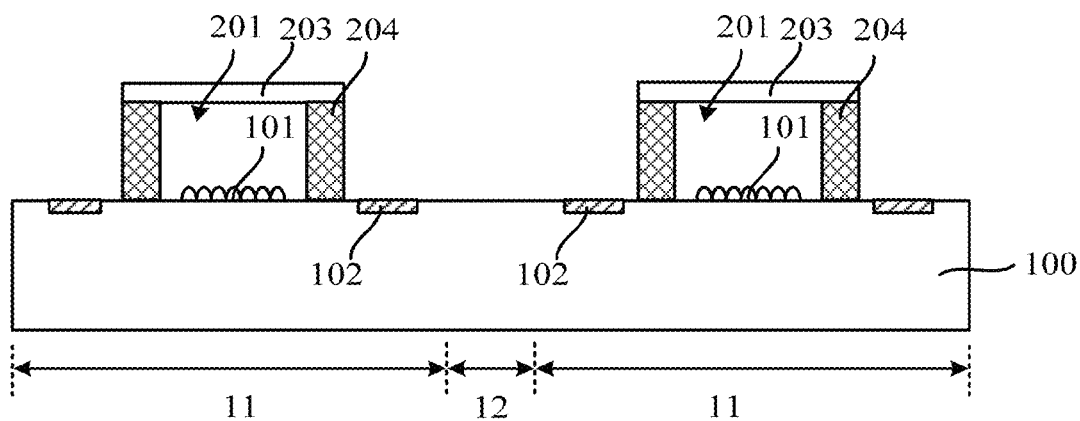

Referring to FIG. 7, the remained second substrate 200 (referring to FIG. 6) on the first substrate 100 may be etched with the remained tape film 202 as a mask until the pads 102 and the cutting trails 12 are exposed.

In some embodiments, the remained second substrate 200 may be removed by a dry plasma stripping process where oxygen is used. The oxygen may form plasmas under the action of radio-frequency power and the plasmas may etch the remained second substrate 200 on the first substrate 100. During the dry plasma stripping process, the sidewalls 204 and the caps 203 of the cavities may prevent the image sensing areas 101 from being damaged.

Figure 8:
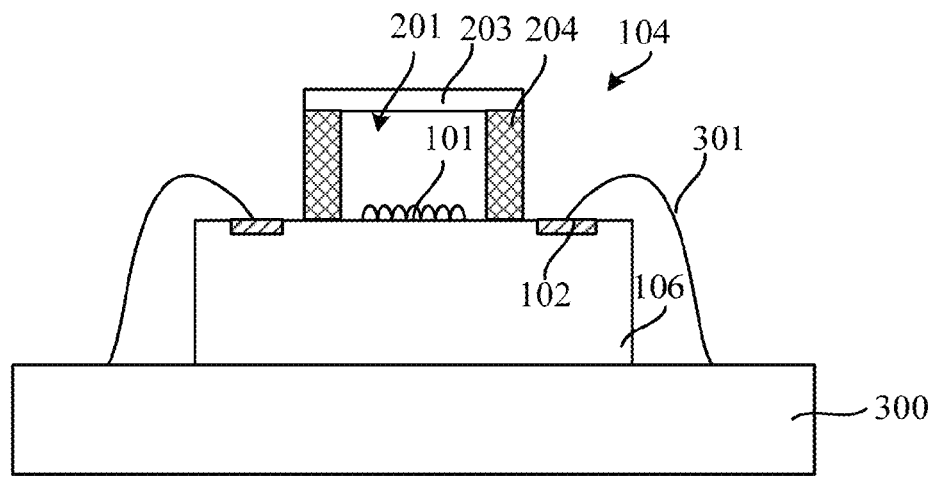

Referring to FIG. 8, the first substrate 100 (referring to FIG. 7) is sliced to form a plurality of single image sensor chips 106, lower surfaces of the plurality of single image sensor chips 106 are attached to an upper surface of a third substrate 300, and the pads 102 on the plurality of image sensor chips 106 are electrically connected with a circuit on the third substrate 300 through wires 301, to form an image sensor package structure 104.

A process for slicing the first substrate 100, a process for contacting the first substrate 100 with the third substrate 300, and a wire bonding process for forming the wires 301 may be performed as existing solutions, which are not described in detail here.

In an embodiment, an image sensor package structure formed by the above method is provided. Referring to FIG. 8, the image sensor package structure includes:

an image sensor chip 106, on an upper surface of the image sensor chip 106 there are formed an image sensing area 101 and pads 102;

a cavity, formed by a cavity wall 204 and a tape layer 203 (i.e., a cap), accommodating the image sensing area 101 inside and keeping the pads 102 outside, wherein the cavity wall 204 is formed on the upper surface of the image sensor chip 106 between the image sensing area 101 and the pads 102, and the cavity wall 204 surrounds the image sensing area 101, wherein the tape layer 203 is formed on an upper surface of the cavity wall 204, and the tape layer 203 seals a space which is above the image sensing area 101 and surrounded by the cavity wall 204;

a third substrate 300 which has a circuit formed thereon, an upper surface of the third substrate 300 being attached with a lower surface of the image sensor chip 106; and wires 301 which electrically connect the pads 102 on the image sensor chip 106 with the circuit on the third substrate 300.

In some embodiments, the cavity wall 204 may include resin. In some embodiments, the tape layer 203 may include a UV peptization tape, a thermal peptization tape or other suitable tapes.

A first protective layer may be formed on the tape layer 203. In some embodiments, the first protective layer may include photoresist or other suitable materials.

Figure 9:
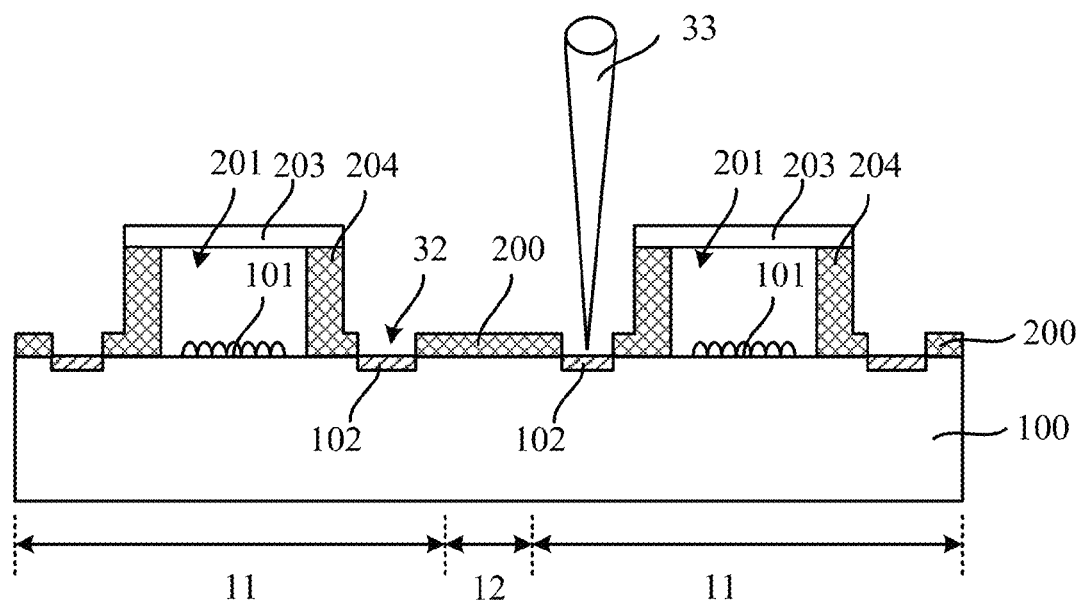
FIGS. 9 and 10 are cross-sectional views schematically illustrating intermediate structures of a packaging process of an image sensor according to an embodiment of the present disclosure.
Figure 10:
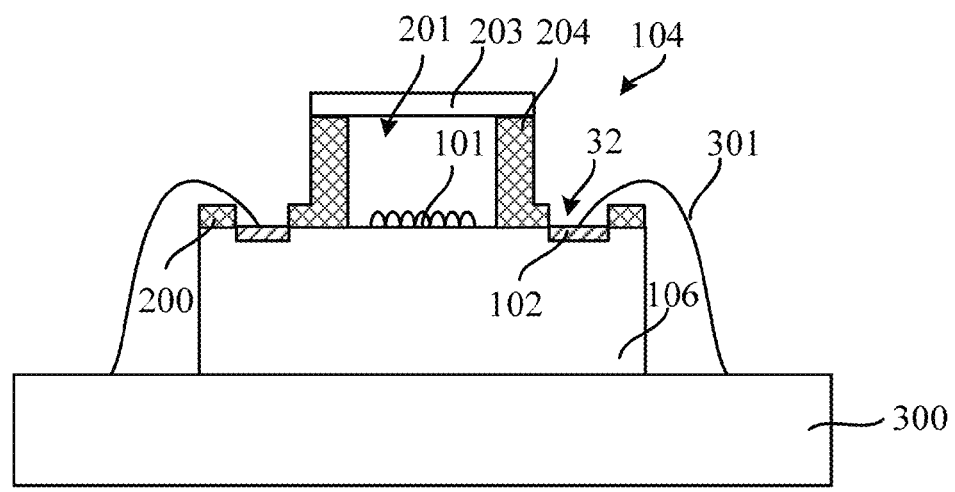

In an embodiment, a packaging process of an image sensor is provided. FIGS. 9 and 10 are cross-sectional views illustrating intermediate structures of the packaging process.

Referring to FIGS. 2 and 3, a first substrate 100 is provided, and a plurality of image sensing areas 101 and a plurality of pads 102 are formed on the substrate 100.

A structure of the first substrate 100, a function of the image sensing areas 101 and positions of the image sensing areas and the pads 102 may be similar with the above embodiment.

Referring to FIG. 4, a second substrate 200 which has a plurality of through holes 201 formed therein is provided. A tape film 202 is formed on an upper surface of the second substrate 200, the tape film 202 sealing a first end of each of the plurality of through holes 201.

In some embodiments, the second substrate 200 may include resin, such as PCB resin. In some embodiments, the plurality of through holes 201 may be formed in the second substrate 200 by punching or drilling. After the tape film 202 is formed on the upper surface of the second substrate 200, the second substrate 200 is attached with the first substrate 100, to avoid damage to the image sensing areas 101. In subsequent processes, the pads 102 may be exposed by a cutting process and a laser stripping process, which may improve packaging efficiency. Besides, portions of the tape film 202 and portions of the second substrate 200 may be removed by a cutting process and a laser stripping process to form cavities each of which includes a sidewall made of a portion of the second substrate 200 and a cap which seals the sidewall from the top and is made of a portion of the tape film 202 and to expose surfaces of the pads 102, which avoids damage or pollution to pads and image sensing areas caused by forming cavities with existing depositing processes and etching processes.

After the through holes 201 are formed in the second substrate 200, the tape film 202 is formed on the upper surface of the second substrate 200. The tape film 202 seals the first end of each of the through holes 201, so that when the remained second substrate 200 on the pads 102 is cut and etched in subsequent processes, the image sensing areas 101 are not exposed outside, which avoids pollution or damage to the image sensing areas 101.

A material and function of the tape film 202 may be similar with the above embodiment.

In some embodiments, the through holes 201 are formed in the second substrate 200 and the tape film 202 sealing the first ends of the through holes 201 is formed on the upper surface of the second substrate 200. In subsequent processes, the cavities including sidewalls and caps are formed to isolate the image sensing areas from external environment. In some embodiments, no through hole may be formed in the second substrate 200. And in subsequent processes, a lower surface of the second substrate 200 may be attached with the upper surface of the first substrate 100, portions of the second substrate 200 may be removed, the remained second substrate 200 may be removed to expose the surfaces of the pads 102 by a laser stripping process, the first substrate 100 may be sliced to form a plurality of single image sensor chips, and the pads 102 on the plurality of single image sensor chips may be electrically connected to a circuit on the third substrate through wires. When the portions of the second substrate 200 are cut and the portions of the remained second substrate 200 are removed, portions of the second substrate 200 on the image sensing areas 101 may prevent the image sensing areas 101 from being damaged or polluted.

Referring to FIG. 5, the lower surface of the second substrate 200 is attached with the upper surface of the first substrate 100 to make the image sensing areas 101 disposed in the through holes 201.

In some embodiments, an attaching process may be similar with the above embodiment.

Referring to FIG. 6, portions of the tape film 202 (referring to FIG. 5) and portions of the second substrate 200 are removed by cutting to form a plurality of cavities each of which includes a sidewall 204 made of a portion of the second substrate 200 and a cap 203 which seals the sidewall 204 from the top and is made of a portion of the tape film 202.

As described in the above embodiment, the portions of the tape film 202 and the portions of the second substrate 200 are removed by cutting with a blade, which, compared with a dry etching process or a wet etching process, is more efficient and simpler, and causes less pollution. Besides, no etching gas or etching solution needs to be selected according to a material to be etched, and no mask layer is needed by cutting with the blade, which may avoid pollution or damage to the image sensing areas 101 when a mask layer is formed and removed.

In some embodiments, after the portions of the tape film 202 and the portions of the second substrate 200 are cut, the remained second substrate 200 on the first substrate 100 may prevent damage to the pads 102 caused by over-segmentation in the cutting process. In subsequent processes, the remained second substrate 200 on the first substrate 100 may be partially removed to expose the surfaces of the pads 102 by a laser stripping process. Then, the pads 102 may be connected with the circuit on the third substrate by wires.

In some embodiments, the remained second substrate 200 on the first substrate 100 after the cutting may include portions, which overlay the pads 102, having a thickness less than 20 μm, which may make the duration of a subsequent laser stripping process shorter.

Referring to FIG. 9, the remained second substrate 200 (referring to FIG. 6) on the first substrate 100 may be partially removed to form openings 32 which are exactly on the plurality of pads 102 by a laser stripping process.

In some embodiment, the opening 32 exactly on the plurality of pads 102 indicates that the openings 32 just expose surfaces of the plurality of pads 102. In some embodiments, the laser stripping process may be used to partially remove the remained second substrate 200. The laser stripping process may include using intense lasers as a heat source to heat the second substrate 200 to make the second substrate 200 heat up rapidly. The second substrate 200 irradiated by the intense lasers may get gasified. During the gasification, new matter may be generated or may not be generated. In some embodiments, using the laser stripping process to partially remove the remained second substrate 200 may include: lasers 33 emitted by a laser head focusing on a portion of the remained second substrate 200, wherein the focused portion aligns with one particular pad of the plurality of pads 102; the laser head moving back and forth relative to the first substrate 100, to remove the focused portion of the remained second substrate 200 to form an opening which exposes the surface of the particular pad. In the laser stripping process, the remained second substrate 200 may be removed selectively without forming a mask layer. The laser stripping process may not bring damage to the caps 203 of the cavities to ensure the entirety of the caps 203, thus, the image sensing areas 101 may be protected better without being damaged or polluted in a subsequent packaging process. Besides, heat generated in the laser stripping process may focus on the remained second substrate 200 on the pads 102 which needs to be removed, while the image sensing areas 101 may not be affected by the heat generated in the laser stripping process, so that a decrease in the detection sensibility of the image sensing areas 101 resulted from damage due to a hyperthermia process may not happen. Besides, the laser stripping process is non-contact etching and a by-product resulted from the laser stripping process is gaseous, which may cause little pollution.

In the laser stripping process, a pulse length is within a range from 1 ns to 200 ns, pulse frequency is within a range from 80 KHz to 200 KHz, energy of the lasers on a focus point is greater than 1E18 W/cm$^2$, and a relative moving speed of a laser head is within a range from 1 mm/s to 25 mm/s. Under the laser stripping process with these parameters, the remained second substrate 200 on the pads 102 may be removed accurately, which avoids any residual second substrate 200 on the pads, brings no damage or little damage to the pads 102, and avoids damage to the caps 203.

The laser stripping process may include a plurality of laser etching processes, such that the focused portion of the remained second substrate 200 is partially removed in each of the laser etching processes until all focused portions of the remained second substrate 200 are removed, which ensures the second substrate 200 exactly on the pads 102 to be removed completely.

When the laser stripping process includes a plurality of laser etching processes, laser powers in the plurality of laser etching processes may be the same or different. In some embodiments, the plurality of laser stripping processes may at least include a first laser etching process and a second laser etching process, where the focused portion of the remained second substrate 200 is removed during the first laser etching process to form a groove, and the focused portion of the remained second substrate 200 may be removed completely during the second laser etching process, to form the opening which exposes a particular pad 102. The laser power in the first laser etching process may be greater than that in the second laser etching process, which ensures to remove the second substrate 200 exactly on the particular pad 102 completely and reduces damage to the particular pad 102. The focused portion of the remained second substrate 200 has a first thickness reduction during the first laser etching process and a second thickness reduction during the second laser etching process, and the first thickness reduction is greater than the second thickness reduction, which improves efficiency of removing the second substrate 200.

The laser stripping process is repeated to form a plurality of openings 32 exposing all the plurality of pads 102, respectively.

In some embodiments, there are a plurality of pads disposed on two sides of the particular image sensing area, and on each side of the particular image sensing area, the pads are arranged in one line, wherein the laser stripping process includes: the lasers emitted by a laser head focusing on a strip of the remained second substrate, wherein the strip of the remained second substrate exactly covers the pads arranged in the one line and portions of the first substrate disposed between each pair of adjacent pads in the one line; and the laser head moving back and forth relative to the first substrate, to remove the strip of the remained second substrate to form an opening which exposes the pads arranged in the one line and the portions of the first substrate disposed between each pair of adjacent pads in the one line.

In some embodiments, the openings 32 may expose the whole surfaces of the pads 102. In some embodiments, the openings 32 may expose a portion of the surfaces of the pads 102.

By employing the laser stripping process, only portions of the second substrate 200 exactly on the pads 102 needs to be removed to expose the surfaces of the pads 102, which improves efficiency of etching. Besides, the remained second substrate 200 on the first substrate 100 may serve as a protective layer to protect semiconductor devices in the first substrate 100. The remained second substrate 200 on the first substrate 100 may be combined with the sidewalls 204 of the cavities to form new sidewalls 204 with a shape of "L". Thus, a contact area between the new sidewalls 204 and surfaces of the first substrate 100 may be greater, thereby improving the mechanical stability of the sidewalls 204 and preventing the sidewalls 204 from collapsing.

Referring to FIG. 10, the first substrate 100 (referring to FIG. 9) is sliced to form a plurality of single image sensor chips 106, lower surfaces of the plurality of single image sensor chips 106 are attached to an upper surface of a third substrate 300, and the pads 102 on the plurality of image sensor chips 106 are electrically connected with a circuit on the third substrate 300 through wires 301, to form an image sensor package structure 104.

A process for slicing the first substrate 100, a process for contacting the first substrate 100 with the third substrate 300, and a wire bonding process for forming the wires 301 may be performed as existing solutions, which are not described in detail here.

In an embodiment, an image sensor package structure formed by the above method is provided. Referring to FIG. 10, the image sensor package structure includes:

an image sensor chip 106, on an upper surface of the image sensor chip 106 there are formed an image sensing area 101 and pads 102;

a cavity, formed by a cavity wall 204 and a tape layer 203 (i.e., a cap), accommodating the image sensing area 101 inside and keeping the pads 102 outside, wherein the cavity wall 204 is formed on the upper surface of the image sensor chip 106 between the image sensing area 101 and the pads 102, and the cavity wall 204 surrounds the image sensing area 101, wherein the tape layer 203 is formed on an upper surface of the cavity wall 204, and the tape layer 203 seals a space which is above the image sensing area 101 and surrounded by the cavity wall 204;

a second protective layer 200 covering an upper surface of the image sensor chip on two sides of the cavity wall 204 and a portion of a sidewall of the cavity wall 204, where opening 32 exposing surfaces of the pads 102 are formed in the second protective layer 200;

a third substrate 300 which has a circuit formed thereon, an upper surface of the third substrate 300 being attached with a lower surface of the image sensor chip 106; and wires 301 which electrically connect the pads 102 on the image sensor chip 106 with the circuit on the third substrate 300.

In some embodiments, the cavity wall 204 may include resin. In some embodiments, the tape layer 203 may include a UV peptization tape, a thermal peptization tape or other suitable tapes.

The second protective layer 200 may include a same material with the cavity wall 204.

The second protective layer 200 may have a thickness less than a height of the cavity wall 204. The second protective layer 200 may have a thickness less than 20 μm.

FIGS. 11 to 14 are cross-sectional views of intermediate structures illustrating a packaging process of an image sensor according to an embodiment of the present disclosure. It should be noted that, parameters and functions of structures in this embodiment, which are the same with the embodiment shown in FIGS. 2 to 8, are not described in detail here. The detailed information can be found in the above description.

Figure 11:
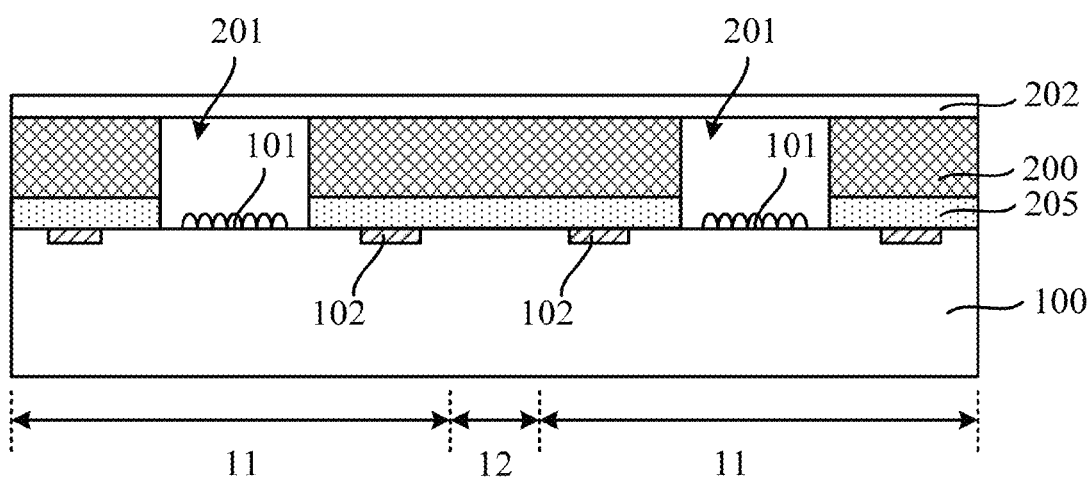
FIGS. 11 to 14 are cross-sectional views schematically illustrating intermediate structures of a packaging process of an image sensor according to an embodiment of the present disclosure.

Referring to FIG. 11, a first substrate 100 is provided, and a plurality of image sensing areas 101 and a plurality of pads 102 are formed on an upper surface of the first substrate 100. A second substrate 200 which has a plurality of through holes 201 formed therein is provided. A tape film 202 is formed on an upper surface of the second substrate 200, the tape film 202 sealing a first end of each of the plurality of through holes 201. The lower surface of the second substrate 200 further includes an adhesive layer 205 which is the lowest layer of the second substrate 200. The second substrate 200 is attached with the upper surface of the first substrate 100 through the adhesive layer 205.

In some embodiments, the second substrate 200 may include glass, silicon or ceramic. The through holes 201 may be formed in the second substrate 200 by a sand blasting process or an etching process.

In some embodiments, the adhesive layer 205 is contained on the lower surface of the second substrate 200. The second substrate 200 and the first substrate 100 are attached together through the adhesive layer 205, which reduces process difficulty. In some embodiments, the second substrate 200 may be attached with the first substrate 100 by a direct bonding process or an anodic bonding process.

The adhesive layer 205 may include epoxy resin adhesive, polyimide adhesive, benzocyclobutene adhesive or polybenzoxazole adhesive. In some embodiments, the adhesive layer 205 may include epoxy resin adhesive. The adhesive layer 205 may be formed on the lower surface of the second substrate 200 by an overlaying process, a glue printing process or a glue rolling process. The adhesive layer 205 is exposed and developed to form openings exposing the through holes 201 in the adhesive layer 205.

In some embodiments, the adhesive layer 205 is used to attach the first substrate 100 with the second substrate 200. Besides, in subsequent processes, after the portions of the tape film 202 and the portions of the second substrate 200 are removed by cutting to form cavities including sidewalls 204 and caps 203, some portions of the adhesive layer 205 remained overlaying the plurality of pads 102 and thereafter are etched to expose the plurality of pads 102. As a material of the adhesive layer 205 is different from that of the sidewalls 204 of the cavities, an etching selectivity ratio of the material of the adhesive layer 205 to the material of the sidewalls 204 of the cavities is increased, so that damage to the sidewalls 204 of the cavities is very little. When the portions of the second substrate 200 are etched to form the sidewalls 204 of the cavities, the sidewalls 204 may have a small thickness, which is benefit for improving an integration level of formed package devices.

In some embodiments, a protective film may be formed on the tape film 202. In subsequent processes, portions of the protective film, portions of the tape film 202 and portions of the second substrate 200 may be removed by cutting, wherein the remained protective film, the remained tape film 202 and the remained second substrate 200 form cavities, each of which includes a sidewall made of a portion of the second substrate 200 and a cap which seals the sidewall from the top and is made of a portion of the tape film 202, and a first protective layer on the caps. When the remained second substrate 200 on the first substrate 100 is removed by a dry plasma stripping process to expose the surfaces of the pads 102, the first protective layer may protect the caps of the cavities without being damaged.

The protective film may include photoresist and may be formed by spinning coating, spraying or overlaying. These processes for forming the protective film are simple and do not bring damage to the tape film. In some embodiments, the protective film may include other suitable materials or be formed by other processes.

Figure 12:
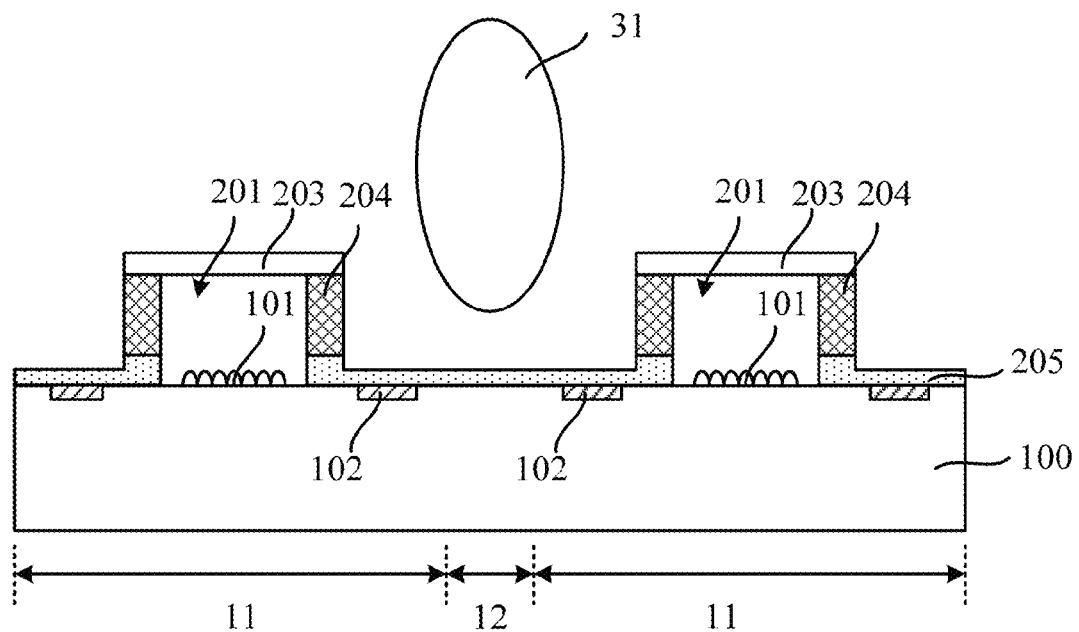

Referring to FIG. 12, portions of the tape film 202 (referring to FIG. 11), portions of the second substrate 200 (referring to FIG. 11) and portions of the adhesive layer 205 are removed by cutting to form a plurality of cavities each of which includes a sidewall 204 made of a portion of the second substrate 200 and a cap 203 which seals the sidewall 204 from the top and is made of a portion of the tape film 202.

The portions of the tape film 202, the portions of the second substrate 200 and the portions of the adhesive layer 205 may be removed by cutting with a blade, which, compared with a dry etching process or a wet etching process, is more efficient and simpler, and causes less pollution. Besides, no mask layer is needed by cutting with the blade, which may avoid pollution or damage to the image sensing areas 101 when a mask layer is formed and removed.

In some embodiments, after the portions of the tape film 202, the portions of the second substrate 200 and the portions of the adhesive layer 205 are cut, the remained adhesive layer 205 on the first substrate 100 may prevent damage to the pads 102 caused by over-segmentation in the cutting process. In subsequent processes, the remained adhesive layer 205 on the first substrate 100 may be partially removed to expose the pads 102 by an etching process.

In some embodiments, the remained adhesive layer 205 on the first substrate 100 after the cutting may include portions, which overlay the pads 102, having a thickness less than 20 μm.

Figure 13:
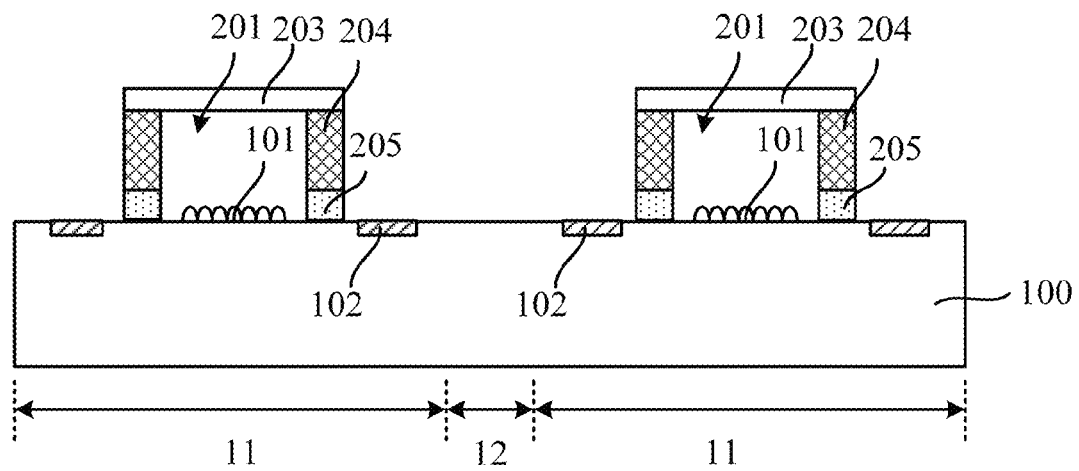

Referring to FIG. 13, the remained adhesive layer 205 (referring to FIG. 12) on the first substrate 100 may be etched with the remained tape film 202 as a mask until the pads 102 are exposed.

In some embodiments, the remained adhesive layer 205 may be removed by an anisotropic dry plasma stripping process where oxygen is used. The dry plasma stripping process may bring little damage to the caps 203 and the pads 102. Besides, a material of the adhesive layer 205 is different from that of the sidewalls 204 of the cavities, thus, etching to the sidewalls 204 during the dry plasma stripping process may be ignored.

Figure 14:
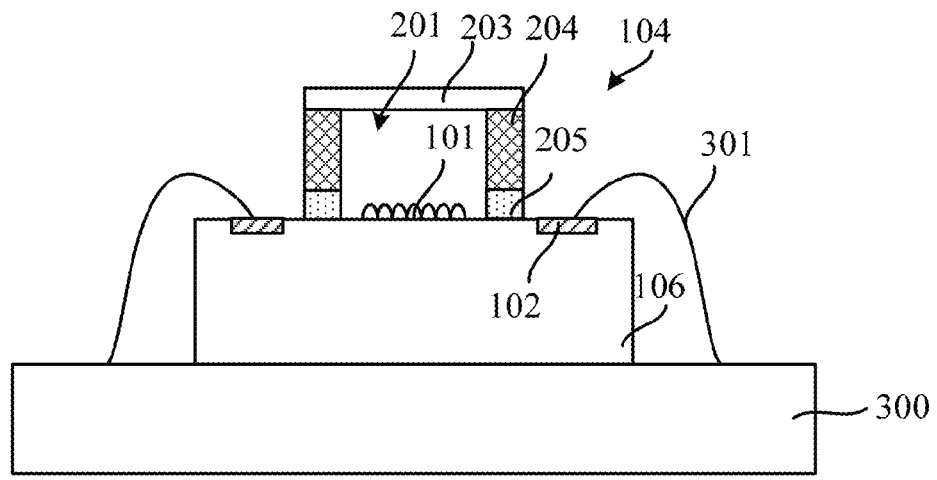

Referring to FIG. 14, the first substrate 100 (referring to FIG. 13) is sliced to form a plurality of single image sensor chips 106, lower surfaces of the plurality of single image sensor chips 106 are attached to an upper surface of a third substrate 300, and the pads 102 on the plurality of image sensor chips 106 are electrically connected with a circuit on the third substrate 300 through wires 301, to form an image sensor package structure 104.

Referring to FIG. 14, an image sensor package structure formed by the above method is provided, including:

an image sensor chip 106, on an upper surface of the image sensor chip 106 there are formed an image sensing area 101 and pads 102;

a cavity, formed by a cavity wall 204 and a tape layer 203 (i.e., a cap), accommodating the image sensing area 101 inside and keeping the pads 102 outside, wherein the cavity wall 204 is formed on the upper surface of the image sensor chip 106 between the image sensing area 101 and the pads 102, and the cavity wall 204 surrounds the image sensing area 101, wherein the tape layer 203 is formed on an upper surface of the cavity wall 204, and the tape layer 203 seals a space which is above the image sensing area 101 and surrounded by the cavity wall 204;

an adhesive layer 205 formed between the cavity wall 204 and the upper surface of the image sensor chip 106;

a third substrate 300 which has a circuit formed thereon, an upper surface of the third substrate 300 being attached with a lower surface of the image sensor chip 106; and wires 301 which electrically connect the pads 102 on the image sensor chip 106 with the circuit on the third substrate 300.

In some embodiments, the cavity wall 204 may include glass, silicon or ceramic.

In some embodiments, the adhesive layer 205 may include epoxy resin adhesive, polyimide adhesive, benzocyclobutene adhesive or polybenzoxazole adhesive. In some embodiments, the adhesive layer 205 includes epoxy resin adhesive.

In some embodiments, the tape layer 203 may include a UV peptization tape or a thermal peptization tape. In other embodiments, the tape layer 203 may include other suitable tapes.

A first protective layer may be formed on the tape layer 203. In some embodiments, the first protective layer may include photoresist or other suitable materials.

Figure 15:
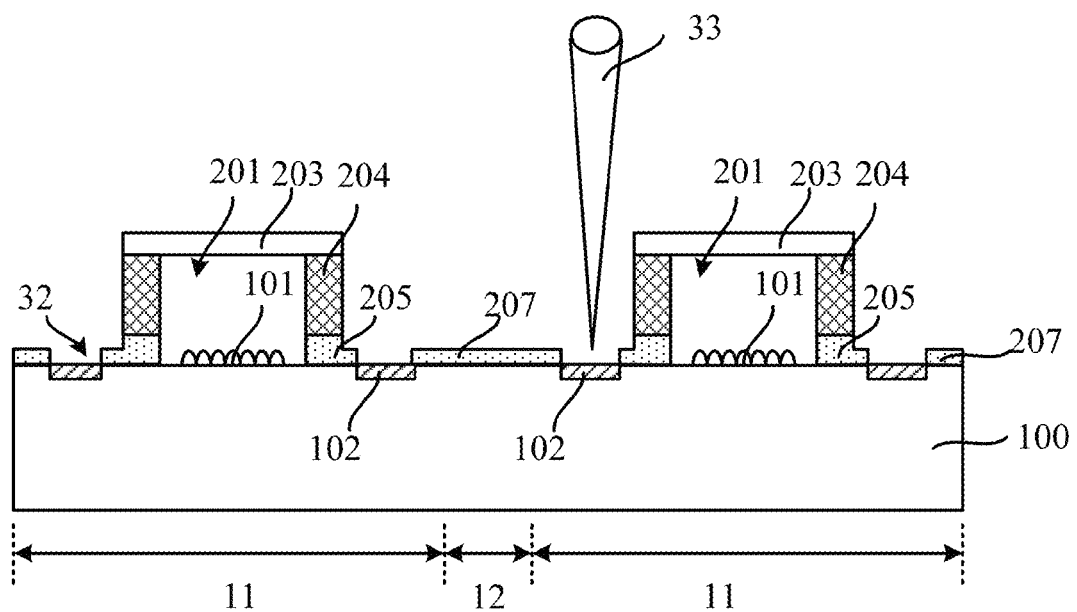
FIGS. 15 and 16 are cross-sectional views schematically illustrating intermediate structures of a packaging process of an image sensor according to an embodiment of the present disclosure.
Figure 16:
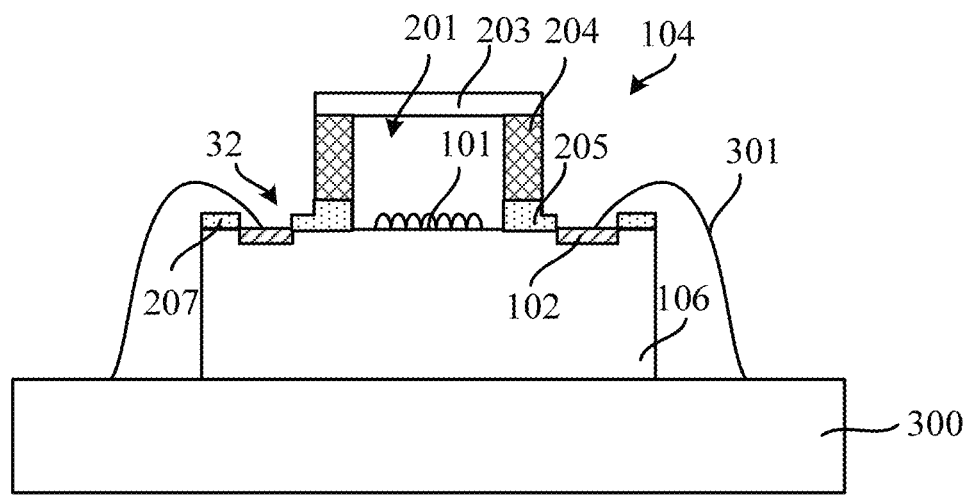

FIGS. 15 and 16 are cross-sectional views of intermediate structures illustrating a packaging process of an image sensor according to an embodiment of the present disclosure. It should be noted that, parameters and functions of structures in this embodiment, which are the same with the embodiment shown in FIGS. 9 and 10, are not described in detail here. The detailed information can be found in the above description.

Referring to FIG. 11, a first substrate 100 is provided, and a plurality of image sensing areas 101 and a plurality of pads 102 are formed on an upper surface of the first substrate 100. A second substrate 200 which has a plurality of through holes 201 formed therein is provided. A tape film 202 is formed on an upper surface of the second substrate 200, the tape film 202 sealing a first end of each of the plurality of through holes 201. The lower surface of the second substrate 200 further includes an adhesive layer 205 which is the lowest layer of the second substrate 200. The second substrate 200 is attached with the upper surface of the first substrate 100 through the adhesive layer 205.

In some embodiments, the second substrate 200 may include glass, silicon or ceramic. The through holes 201 may be formed in the second substrate 200 by a sand blasting process or an etching process.

In some embodiments, the adhesive layer 205 is contained on the lower surface of the second substrate 200. The second substrate 200 and the first substrate 100 are attached together through the adhesive layer 205, which reduces process difficulty. In some embodiments, the second substrate 200 may be attached with the first substrate 100 by a direct bonding process or an anodic bonding process.

The adhesive layer 205 may include epoxy resin adhesive, polyimide adhesive, benzocyclobutene adhesive or polybenzoxazole adhesive. In some embodiments, the adhesive layer 205 may include epoxy resin adhesive. The adhesive layer 205 may be formed on the lower surface of the second substrate 200 by an overlaying process, a glue printing process or a glue rolling process. The adhesive layer 205 is exposed and developed to form openings exposing the through holes 201 in the adhesive layer 205.

In some embodiments, the adhesive layer 205 is used to attach the first substrate 100 with the second substrate 200. Besides, in subsequent processes, after portions of the second substrate 200 and portions of the adhesive layer 205 are removed by cutting to form cavities including sidewalls 204 and caps 203, a laser stripping process may be employed to remove portions of the remained adhesive layer 205 to expose surfaces of the pads 102, which may not bring damage to the tape film 202.

Referring to FIG. 12, portions of the tape film 202 (referring to FIG. 11), portions of the second substrate 200 (referring to FIG. 11) and portions of the adhesive layer 205 are removed by cutting to form a plurality of cavities each of which includes a sidewall 204 made of a portion of the second substrate 200 and a cap 203 which seals the sidewall 204 from the top and is made of a portion of the tape film 202.

The portions of the tape film 202, the portions of the second substrate 200 and the portions of the adhesive layer 205 may be removed by cutting with a blade, which, compared with a dry etching process or a wet etching process, is more efficient and simpler, and causes less pollution. Besides, no mask layer is needed by cutting with the blade, which may avoid pollution or damage to the image sensing areas 101 when a mask layer is formed and removed.

In some embodiments, after the portions of the tape film 202, the portions of the second substrate 200 and the portions of the adhesive layer 205 are cut, the remained adhesive layer 205 on the first substrate 100 may prevent damage to the pads 102 caused by over-segmentation in the cutting process. In subsequent processes, the remained adhesive layer 205 on the first substrate 100 may be partially removed by a laser stripping process to expose the pads 102, which enables a wiring process to be performed. Then, the pads 102 may be connected with a circuit on a third substrate through wires.

In some embodiments, the remained adhesive layer 205 on the first substrate 100 after the cutting may include portions, which overlay the pads 102, having a thickness less than 20 μm.

Referring to FIG. 15, the remained adhesive layer 205 on the first substrate 100 may be partially removed to expose the surfaces of the pads 102 by a laser stripping process.

In some embodiments, the remained adhesive layer 205 may be removed by the laser stripping process. In some embodiments, using the laser stripping process to partially remove the remained adhesive layer 205 may include: lasers 33 emitted by a laser head focusing on a portion of the remained adhesive layer 205; the laser head moving back and forth relative to the first substrate 100, to remove the focused portion of the remained adhesive layer 205 to form an opening 32 which exposes the surface of a particular pad 102. In the laser stripping process, the remained adhesive layer 205 may be removed selectively without forming a mask layer. The laser stripping process may not bring damage to the caps 203 of the cavities to ensure the entirety of the caps 203, thus, the image sensing areas 101 may be protected better without being damaged or polluted in a subsequent packaging process. Besides, the laser stripping process is non-contact etching and a by-product resulted from the laser stripping process is gaseous, which may cause little pollution.

In the laser stripping process, a pulse length is within a range from 1 ns to 200 ns, pulse frequency is within a range from 80 KHz to 200 KHz, energy of the lasers on a focus point is greater than $1E18$ $W/cm^2$, and a relative moving speed of a laser head is within a range from 1 mm/s to 25 mm/s. Under the laser stripping process with these parameters, the remained adhesive layer 205 on the pads 102 may be removed accurately, which avoids any residual adhesive layer 205, brings no damage or little damage to the pads 102, and avoids damage to the caps 203.

The laser stripping process may include a plurality of laser etching processes, such that the focused portion of the remained adhesive layer 205 is partially removed in each of the laser etching processes until all focused portions of the remained adhesive layer 205 are removed, which ensures the adhesive layer 205 exactly on the pads 102 to be removed completely.

When the laser stripping process includes a plurality of laser etching processes, laser powers in the plurality of laser etching processes may be the same or different. In some embodiments, the plurality of laser stripping processes may at least include a first laser etching process and a second laser etching process, where the focused portion of the remained adhesive layer 205 is removed during the first laser etching process, to form a groove, and the focused portion of the remained adhesive layer 205 may be removed completely during the second laser etching process, to form the opening 32 which exposes the particular pad 102. The laser power in the first laser etching process may be greater than that in the second laser etching process, which ensures to remove the adhesive layer 205 exactly on the pads 102 completely and reduces damage to the pads 102. The focused portion of the remained adhesive layer 205 has a first thickness reduction during the first laser etching process and a second thickness reduction during the second laser etching process, and the first thickness reduction is greater than the second thickness reduction, which improves efficiency of removing the adhesive layer 205.

The laser stripping process is repeated to form a plurality of openings 32 exposing all the plurality of pads 102, respectively.

In some embodiments, there are a plurality of pads disposed on two sides of the particular image sensing area, and on each side of the particular image sensing area, the pads are arranged in one line, wherein the laser stripping process includes: the lasers emitted by a laser head focusing on a strip of the remained adhesive layer, wherein the strip of the remained adhesive layer exactly covers the pads arranged in the one line and portions of the first substrate disposed between each pair of adjacent pads in the one line; and the laser head moving back and forth relative to the first substrate, to remove the strip of the remained adhesive layer to form an opening which exposes the pads arranged in the one line and the portions of the first substrate disposed between each pair of adjacent pads in the one line. In some embodiments, the openings 32 may expose the whole surfaces of the pads 102. In some embodiments, the openings 32 may expose a portion of the surfaces of the pads 102.

By employing the laser stripping process, only portions of the adhesive layer 205 exactly on the pads 102 needs to be removed to expose the surfaces of the pads 102, which improves etching efficiency. Besides, the remained adhesive layer 205 on the first substrate 100 may serve as a second protective layer 207 to protect semiconductor devices in the first substrate 100. The remained adhesive layer 205 on the first substrate 100 may be combined with the sidewalls 204 of the cavities to form new sidewalls 204 with a shape of "L". Thus, a contact area between the new sidewalls 204 and surfaces of the first substrate 100 may be greater, thereby improving the mechanical stability of the sidewalls 204 and preventing the sidewalls 204 from collapsing.

Referring to FIG. 16, the first substrate 100 (referring to FIG. 15) is sliced to form a plurality of single image sensor chips 106, lower surfaces of the plurality of single image sensor chips 106 are attached to an upper surface of a third substrate 300, and the pads 102 on the plurality of image sensor chips 106 are electrically connected with a circuit on the third substrate 300 through wires 301, to form an image sensor package structure 104.

Referring to FIG. 16, an image sensor package structure formed by the above method was provided, including:

an image sensor chip 106, on an upper surface of the image sensor chip 106 there are formed an image sensing area 101 and pads 102;

a cavity, formed by a cavity wall 204 and a tape layer 203 (i.e., a cap), accommodating the image sensing area 101 inside and keeping the pads 102 outside, wherein the cavity wall 204 is formed on the upper surface of the image sensor chip 106 between the image sensing area 101 and the pads 102, and the cavity wall 204 surrounds the image sensing area 101, wherein the tape layer 203 is formed on an upper surface of the cavity wall 204, and the tape layer 203 seals a space which is above the image sensing area 101 and surrounded by the cavity wall 204;

an adhesive layer 205 formed between the cavity wall 204 and the upper surface of the image sensor chip 106;

a second protective layer 207 covering an upper surface of the image sensor chip on two sides of the cavity wall 204 and a portion of a sidewall of the cavity wall 204, where openings 32 exposing surfaces of the pads 102 are formed in the second protective layer 200;

a third substrate 300 which has a circuit formed thereon, an upper surface of the third substrate 300 being attached with a lower surface of the image sensor chip 106; and wires 301 which electrically connect the pads 102 on the image sensor chip 106 with the circuit on the third substrate 300.

In some embodiments, the cavity wall 204 may include glass, silicon or ceramic.

In some embodiments, the adhesive layer 205 may include epoxy resin adhesive, polyimide adhesive, benzocyclobutene adhesive or polybenzoxazole adhesive. In some embodiments, the adhesive layer 205 includes epoxy resin adhesive.

In some embodiments, the tape layer 203 may include a UV peptization tape or a thermal peptization tape. In some embodiments, the tape layer 203 may include other suitable tapes.

The second protective layer 207 may include a same material with the adhesive layer 205.

The second protective layer 207 may have a thickness less than a height of the cavity wall 204. The second protective layer 207 may have a thickness less than 20 µm.

In embodiments of the present disclosure, image sensor package structures and methods are provided. Cavity walls and a tape layer are formed and used to seal image sensing areas, which may prevent the image sensing areas from being exposed. Therefore, during a packaging process of image sensors, pollution or damage to the image sensing areas may be avoided. Besides, pads are exposed by cutting and a dry plasma stripping process or a laser stripping process, which may avoid pollution and damage to the pads resulted from other processes. Further, the cavity walls and the tape layer are formed by cutting, which may avoid pollution and damage to the image sensing areas resulted from other processes.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure. Therefore, the protection scope of the present disclosure is subject to the scope defined by the claims.

The invention claimed is:

1. An image sensor package method, comprising:
providing a first substrate, wherein the first substrate has an upper surface on which a plurality of image sensing areas and a plurality of pads are formed;
providing a second substrate which has a plurality of through holes formed therein;
forming a tape film on an upper surface of the second substrate to seal one end of each of the plurality of through holes;
contacting a lower surface of the second substrate with the upper surface of the first substrate to make the plurality of image sensing areas disposed in the plurality of through holes and the plurality of pads disposed outside the through holes;
removing portions of the tape film and portions of the second substrate by cutting, wherein the remained tape film and the remained second substrate form cavities each of which comprises a sidewall made of a portion of the second substrate and a cap which seals the sidewall from the top and is made of a portion of the tape film, and the remained second substrate also covers the plurality of pads;
removing portions of the remained second substrate to expose the plurality of pads;
slicing the first substrate to form a plurality of single image sensor chips each of which comprises at least one of the image sensing areas and at least one of the pads; and
electrically connecting the at least one pad on one of the plurality of single image sensor chips with a circuit on a third substrate through wires.

2. The method according to claim 1, wherein a blade is used to cut the portions of the tape film and the portions of the second substrate.

3. The method according to claim 1, wherein removing portions of the remained second substrate to expose the plurality of pads comprises: etching the remained second substrate with the remained tape film as a mask until the plurality of pads are exposed.

4. The method according to claim 1, wherein removing portions of the remained second substrate to expose the plurality of pads comprises: partially removing the remained second substrate to form openings which are exactly on the plurality of pads by a laser stripping process.

5. The method according to claim 1, wherein the remained second substrate after the cutting comprises portions, which overlay the plurality of pads, having a thickness less than 20 μm.

6. The method according to claim 1, wherein the second substrate comprises resin.

7. The method according to claim 1, wherein the second substrate comprises glass, silicon or ceramic.

8. The method according to claim 7, wherein the lower surface of the second substrate comprises an adhesive layer which is the lowest layer of the second substrate, and the second substrate is attached with the upper surface of the first substrate through the adhesive layer.

9. The method according to claim 8, wherein the adhesive layer comprises epoxy resin adhesive, polyimide adhesive, benzocyclobutene adhesive or polybenzoxazole adhesive.

10. The method according to claim 8, wherein after the portions of the tape film and the portions of the second substrate are removed by cutting, there are some portions of the adhesive layer remained overlaying the plurality of pads, and thereafter the remained portions of the adhesive layer are etched to expose the plurality of pads with the remained tape film as a mask.

11. The method according to claim 8, wherein after the portions of the tape film and the portions of the second substrate are removed by cutting, there are some portions of the adhesive layer remained overlaying the pads, and thereafter the remained portions of the adhesive layer are partially removed by a laser stripping process to form openings which are exactly on the pads, such that the pads are exposed.

12. The method according to claim 1, wherein the tape film comprises an ultraviolet ray peptization tape or a thermal peptization tape.

13. The method according to claim 3, further comprising:
before the cutting, forming a protective film on the tape film, such that after the cutting, portions of the protective film are remained to cover the remained tape film.

14. The method according to claim 13, wherein the protective film comprises photoresist.

15. The method according to claim 4, wherein removing portions of the remained second substrate on the plurality of pads by a laser stripping process comprises:
lasers emitted by a laser head focusing on a portion of the remained second substrate, wherein the focused portion aligns with one particular pad of the plurality of pads; and
the laser head moving back and forth relative to the first substrate, to remove the focused portion of the remained second substrate to form an opening which exposes the surface of the particular pad.

16. The method according to claim 15, wherein during the laser stripping process, pulse length of the lasers is within a range from 1 ns to 200 ns, pulse frequency is within a range from 80 KHz to 200 KHz, energy of the lasers on a focus point is greater than 1E18 W/cm$^2$, and a relative moving speed of the laser head is within a range from 1 mm/s to 25 mm/s.

17. The method according to claim 15, wherein the laser stripping process comprises a plurality of laser etching processes, such that the focused portion of the remained second substrate is partially removed in each of the laser etching processes until all focused portions of the remained second substrate are removed.

18. The method according to claim 15, wherein the laser stripping process comprises a plurality of laser etching processes, and laser powers in the plurality of laser etching processes are the same or different.

19. The method according to claim 18, wherein the plurality of laser etching processes comprise at least a first laser etching process and a second laser etching process, where the focused portion of the remained second substrate is partially removed during the first laser etching process to form a groove, and the focused portion of the remained second substrate is completely removed during the second laser etching process, to form the opening which exposes the particular pad.

20. The method according to claim 19, wherein laser power in the first laser etching process is greater than that in the second laser etching process.

21. The method according to claim 20, wherein the focused portion of the remained second substrate has a first thickness reduction during the first laser etching process and a second thickness reduction during the second laser etching process, and the first thickness reduction is greater than the second thickness reduction.

22. The method according to claim 15, wherein the laser stripping process is repeated to form a plurality of openings exposing all the plurality of pads, respectively.

23. The method according to claim 15, wherein there are a plurality of pads disposed on two sides of the particular image sensing area, and on each side of the particular image sensing area, the pads are arranged in one line, wherein the laser stripping process comprises:
the lasers emitted by a laser head focusing on a strip of the remained second substrate, wherein the strip of the remained second substrate exactly covers the pads arranged in the one line and portions of the first substrate disposed between each pair of adjacent pads in the one line; and
the laser head moving back and forth relative to the first substrate, to remove the strip of the remained second substrate to form an opening which exposes the pads arranged in the one line and the portions of the first substrate disposed between each pair of adjacent pads in the one line.

24. The method according to claim 11, wherein partially removing the remained portions of the adhesive layer by a laser stripping process comprises:
lasers emitted by a laser head focusing on a portion of the remained adhesive layer on the pad, wherein the focused portion aligns with one particular pad of the plurality of pads; and
the laser head moving back and forth relative to the first substrate, to remove the focused portion of the remained adhesive layer to form an opening which exposes the surface of the particular pad.

25. An image sensor package method, comprising:
providing a first substrate, wherein the first substrate has an upper surface on which a plurality of image sensing areas and a plurality of pads are formed;
providing a second substrate and contacting a lower surface of the second substrate with the upper surface of the first substrate;
removing a portion of the second substrate on the pad by cutting;
removing the remained second substrate on the pad to expose the plurality of pads;
slicing the first substrate to form a plurality of single image sensor chips each of which comprises at least one of the image sensing areas and at least one of the pads; and
electrically connecting the at least one pad on one of the plurality of single image sensor chips with a circuit on a third substrate through wires.

26. The method according to claim 25, wherein the remained second substrate on the pad is removed by a dry plasma stripping process.

27. The method according to claim 25, wherein the remained second substrate on the pad is removed by a laser stripping process.

28. An image sensor package structure formed by the method according to claim 1, comprising:
an image sensor chip, on an upper surface of the image sensor chip there are formed an image sensing area and the at least one pad;
the cavity, formed by the sidewall and the cap, accommodating the image sensing area inside and keeping the at least one pad outside, wherein the sidewall is formed on the upper surface of the image sensor chip between the image sensing area and the at least one pad, and the sidewall surrounds the image sensing area, wherein the cap is formed on an upper surface of the sidewall, and the cap seals a space which is above the image sensing area and surrounded by the sidewall;
the third substrate which has the circuit formed thereon, an upper surface of the third substrate being attached with a lower surface of the image sensor chip; and
the wires which electrically connect the at least one pad on the image sensor chip with the circuit on the third substrate.

29. The image sensor package structure according to claim 28, wherein the sidewall comprises resin.

30. The image sensor package structure according to claim 28, wherein the sidewall comprises glass, silicon or ceramic.

31. The image sensor package structure according to claim 30, wherein an adhesive layer is formed between the sidewall and the first substrate.

32. The image sensor package structure according to claim 31, wherein the adhesive layer comprises epoxy resin adhesive, polyimide adhesive, benzocyclobutene adhesive or polybenzoxazole adhesive.

33. The image sensor package structure according to claim 28, wherein a first protective layer is formed on the cap.

34. The image sensor package structure according to claim 33, wherein the first protective layer comprises photoresist.

35. The image sensor package structure according to claim 28, further comprising a second protective layer, where the second protective layer covers the upper surface of the image sensor chip on two sides of the sidewall and a portion of a sidewall of the sidewall, and an opening exposing the surface of the at least one pad is formed in the second protective layer.

36. The image sensor package structure according to claim 35, wherein the second protective layer has a thickness less than a height of the sidewall which constitutes the cavity.

37. The image sensor package structure according to claim 36, wherein the second protective layer has a thickness less than 20 μm.

38. The image sensor package structure according to claim 28, wherein the cap comprises a UV peptization tape or a thermal peptization tape.

* * * * *